United States Patent [19]

Gibson et al.

[11] Patent Number: 5,705,936
[45] Date of Patent: Jan. 6, 1998

[54] METHOD AND APPARATUS FOR AUTOMATICALLY TESTING SEMICONDUCTOR DIODES

[75] Inventors: Robert T. Gibson, Snohomish; Todd E. Holmdahl, Bothell, both of Wash.

[73] Assignee: Fluke Corporation, Everett, Wash.

[21] Appl. No.: 708,510

[22] Filed: Sep. 5, 1996

Related U.S. Application Data

[62] Division of Ser. No. 376,602, Jan. 23, 1995, Pat. No. 5,578,936.

[51] Int. Cl.⁶ ................................................. G01R 29/12
[52] U.S. Cl. ........................... 324/767; 324/115; 324/133
[58] Field of Search .............................. 324/767, 73.1, 324/768, 115, 121 R, 116, 99 D, 133; 340/657, 660; 364/487, 550

[56] References Cited

U.S. PATENT DOCUMENTS

| 4,346,347 | 8/1982 | Kamata et al. | 324/767 |
| 5,355,082 | 10/1994 | Schreibner et al. | 324/768 |
| 5,414,373 | 5/1995 | Schreibner et al. | 324/768 |

FOREIGN PATENT DOCUMENTS

| 5060798 | 3/1993 | Japan | 324/115 |
| 1705783 | 1/1992 | U.S.S.R. | |

*Primary Examiner*—Vinh P. Nguyen
*Attorney, Agent, or Firm*—Douglas J. Barker

[57] ABSTRACT

A potable electronic test instrument is adapted for the automatic testing of semiconductor diodes regardless of the orientation of the diode relative to the test probes. The test instrument supplies an a.c. sine wave test voltage coupled to the test probes. The maximum negative voltage and the maximum positive voltage are measured and compared against a set of predetermined open and short circuit values to obtain a decision of open, short, or ok for each value. The combination of the two comparisons is used to determine the device status according to a decision criteria. The diode status is accordingly displayed on the graphical display of the test instrument, indicating the device is open, shorted, a diode with a forward orientation or a reverse orientation with respect to the test probes, or of an unknown type. The diode forward bias junction voltage is displayed regardless of its orientation.

16 Claims, 9 Drawing Sheets

METHOD AND APPARATUS FOR AUTOMATICALLY TESTING SEMICONDUCTOR DIODES

This is a divisional of the prior application Ser. No. 08/376,602 filed Jan. 23, 1995 (now U.S. Pat. No. 5,578,936).

BACKGROUND OF THE INVENTION

This invention relates generally to electronic test instruments and in particular to a test instrument adapted to automatically test semiconductor diodes by displaying both the actual diode orientation relative to the test probes and the forward bias junction voltage.

Semiconductor diodes are typically constructed of silicon or germanium material with two dissimilarly doped regions abutting against each other to form a junction. This junction has the property of allowing the conduction of electrical current in one direction and not the other. Diodes are used in a wide variety of electrical and electronic applications and play a number of different roles, including rectifiers in power supplies, switching elements in high frequency circuits, voltage references and detectors. While the construction of diodes varies as widely as their applications, their common feature is in allowing current flow in one direction as a unipolar device. Test instruments adapted for testing diodes seek to exploit this unipolar feature in providing information on the condition of a diode during service and trouble shooting operations. The terminals of the diode are labeled as the anode and the cathode. The physical orientation of axial-leaded diode is typically indicated with the cathode as the banded end. However, diodes are often unmarked and sometimes mismarked, and the test instrument must be able to resolve the correct orientation of the diode relative to the test probes.

Curve tracers are typically large, sophisticated instruments designed for the laboratory environment to precisely characterize semiconductor devices over a continuous range of voltage and current levels. Curve tracers commonly provide for a bipolar test signal in the form of a swept current or voltage that sweeps from a negative to a positive voltage while the instrument monitors the desired device response and traces a curve on a display for the user. In this way, a complete diode curve including both forward and reverse orientations may be traced out to provide detailed information on the diode resistance, forward junction voltage, and reverse breakdown voltage, among other parameters. Such information is important to electronic designers. However, the curve tracer is ill suited for a troubleshooting environment in which the technician only wishes to know whether the diode is "good" or "bad" as well as the diode orientation relative to the test probes.

A digital multimeter that includes a resistance measuring function is the most common troubleshooting tool. Testing a diode with the resistance measuring function involves measuring the resistance across the diode first in one direction and then in the other. The unipolar nature of the diode provides for a relatively low resistance in one direction and a relatively high resistance in the other. A more meaningful indicator of a condition of the diode is its forward bias junction voltage. A diode constructed of various types of semiconductor material, such as silicon, tend to exhibit well-known voltage drops across the junction while the diode is biased in the forward direction. Silicon diodes tend to have a forward bias junction voltage in the range of 0.55 to 0.6 volts. Consequently, instrument manufacturers have implemented a diode test function in their digital multimeters that provides a measure of the forward bias junction voltage by coupling a d.c. (direct current) voltage source across the diode in the forward bias polity and measuring the voltage drop across the diode.

A failed diode most commonly resembles either an open circuit or a short circuit, which are conditions relatively easy to detect with a multimeter. A "good" diode is one that conducts current in the forward direction only and assumes a forward bias junction voltage within an anticipated voltage range. A reverse-biased diode resembles an open circuit with no current flow. Evaluating diode orientation requires knowledge of the direction of the current flow through the test probes which are typically supplied in red and black colors to indicate a predetermined polarity. According to standard industry convention, the black test probe is placed on the anode and the rod test probe is placed on the cathode to obtain the proper polarity to forward bias the diode and thereby obtain its forward bias junction voltage on a digital multimeter. The user must still manually probe the diode in both orientations in order to fully evaluate the function of the diode in both polarities.

Therefore, it would be desirable to provide a portable test instrument that has the capability of evaluating a diode in both directions, with no need for the user to manually reverse directions with the test probes, to supply information to the user regarding the diode forward junction voltage and the orientation of the diode relative to the test probes if the diode is deemed to be good and otherwise to supply information on whether the diode is open or shorted. In cases where there is no clear bipolar nature of the device being tested, such as a resistor that conducts current equally in either direction, the instrument simply returns information to the effect that the device is unknown.

SUMMARY OF THE INVENTION

In accordance with the present invention, a portable electronic test instrument is provided that supplies a test voltage first in one direction and then in the other direction to a device coupled to the instrument test probes. The maximum voltage drops across the device in the positive and negative polarity are stored as measurement data. A first comparison is made for the maximum voltage drop in the positive polarity against a set of predetermined open and short circuit values. A second comparison is then made for the maximum voltage drop in the negative polarity against the predetermined set of open and short circuit values. The results of the first and the second comparison are device conditions of open, short, or ok.

The results of the first and second comparisons are used to determine whether the device is an open circuit, short circuit, diode, or an unknown circuit, according to a decision criteria. If the device has a forward voltage drop which is within predetermined limits for semiconductor diodes in one polarity and a reverse voltage drop equal to the test voltage in the other, it is deemed to be a diode device and the instrument provides the diode forward junction voltage and orientation to the user on the instrument display. If the voltage drop is below a predetermined threshold for a short circuit in both directions, the instrument responsively provides an indication of a device short circuit to the user. If the voltage drop is above a predetermined threshold for open circuit in both directions, the instrument responsively provides an indication of a device open circuit to the user. In all other cases where the comparisons fall outside the criteria for an open circuit, short circuit, or normal device, the instrument displays an indication of unknown device to the user.

One object of the present invention is to provide a portable test instrument to test semiconductor diodes regardless of the diode orientation relative to the test probes.

A further object of the present invention is to provide a portable test instrument which generates a bipolar signal to test semiconductor diodes in both orientations and indicates the diode forward bias voltage drop regardless of the diode orientation relative to the test probes.

Another object of the present invention is to provide a portable test instrument which generates a bipolar signal to test semiconductor diodes in both orientations and indicates the orientation of the diode relative to the test probes and the diode forward bias voltage drop.

An additional object of the present invention is to provide a portable test instrument which generates a bipolar signal consisting of an a.c. sine wave to test semiconductor diodes and indicates the orientation of the diode relative to the test probes and the diode forward bias voltage drop.

Other features, attainments, and advantages will become apparent to those skilled in the an upon a reading of the following description when taken in conjunction with the accompanying drawings.

Figure 5:
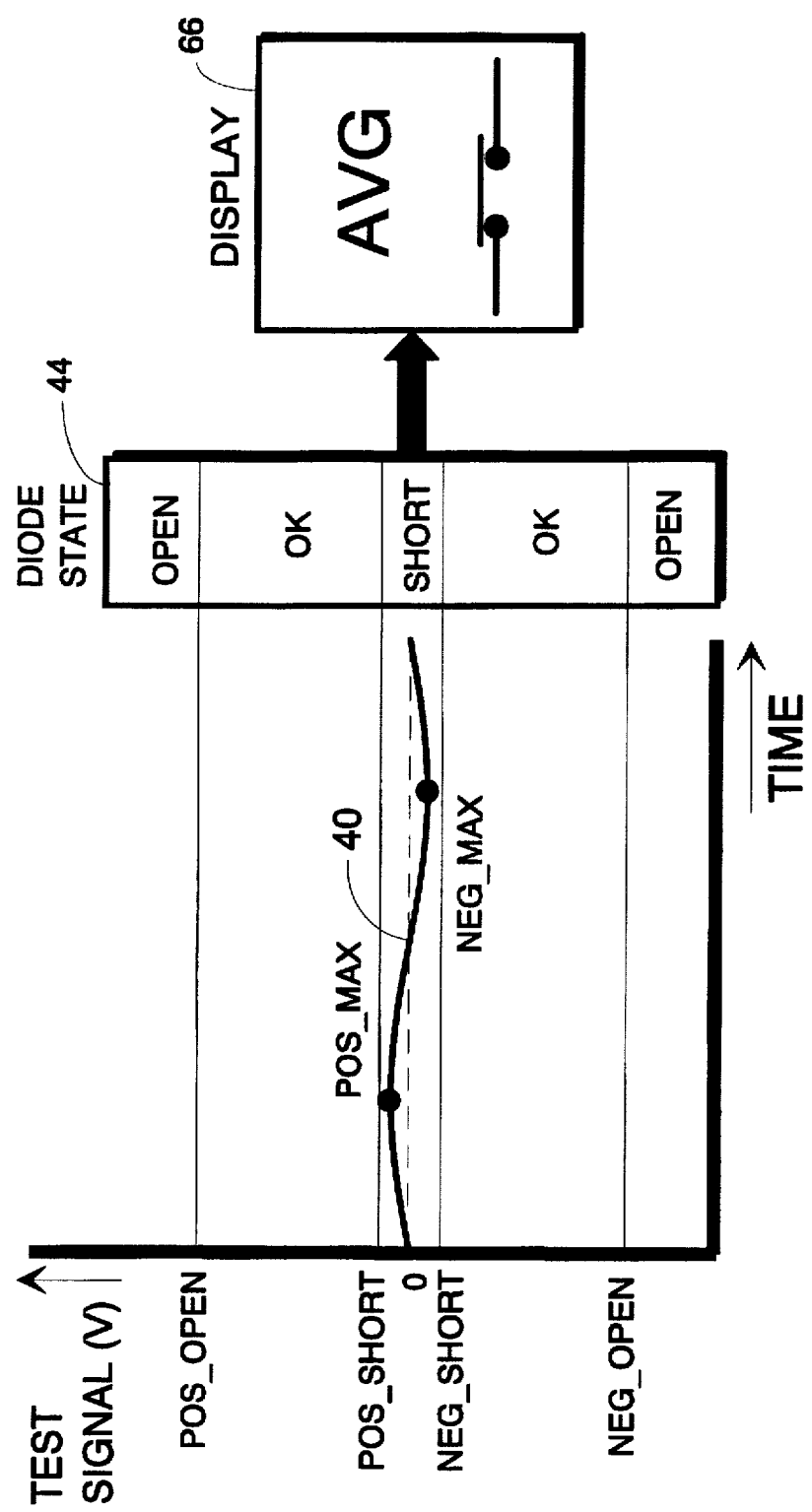
Figure 6:
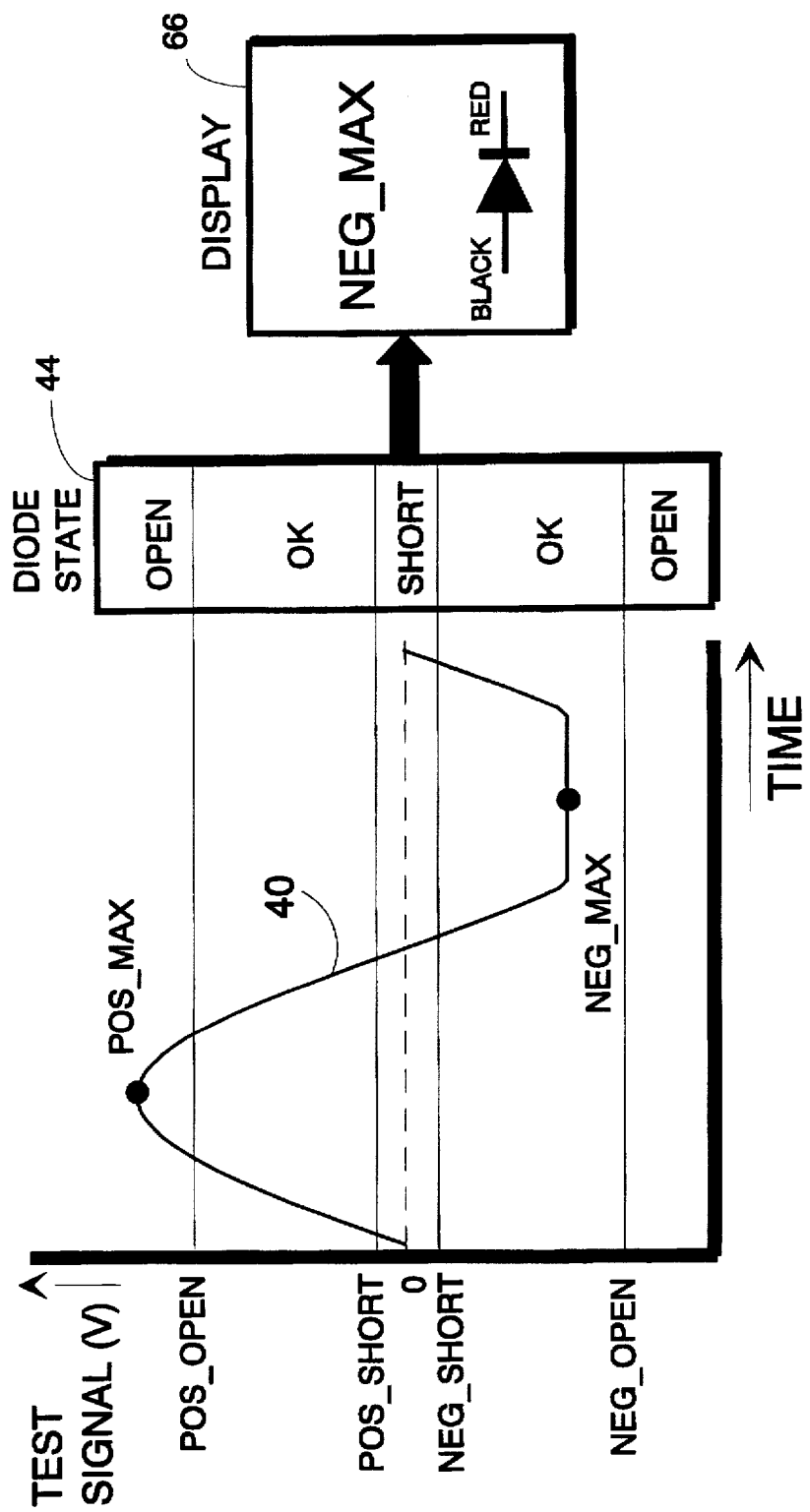
Figure 7:
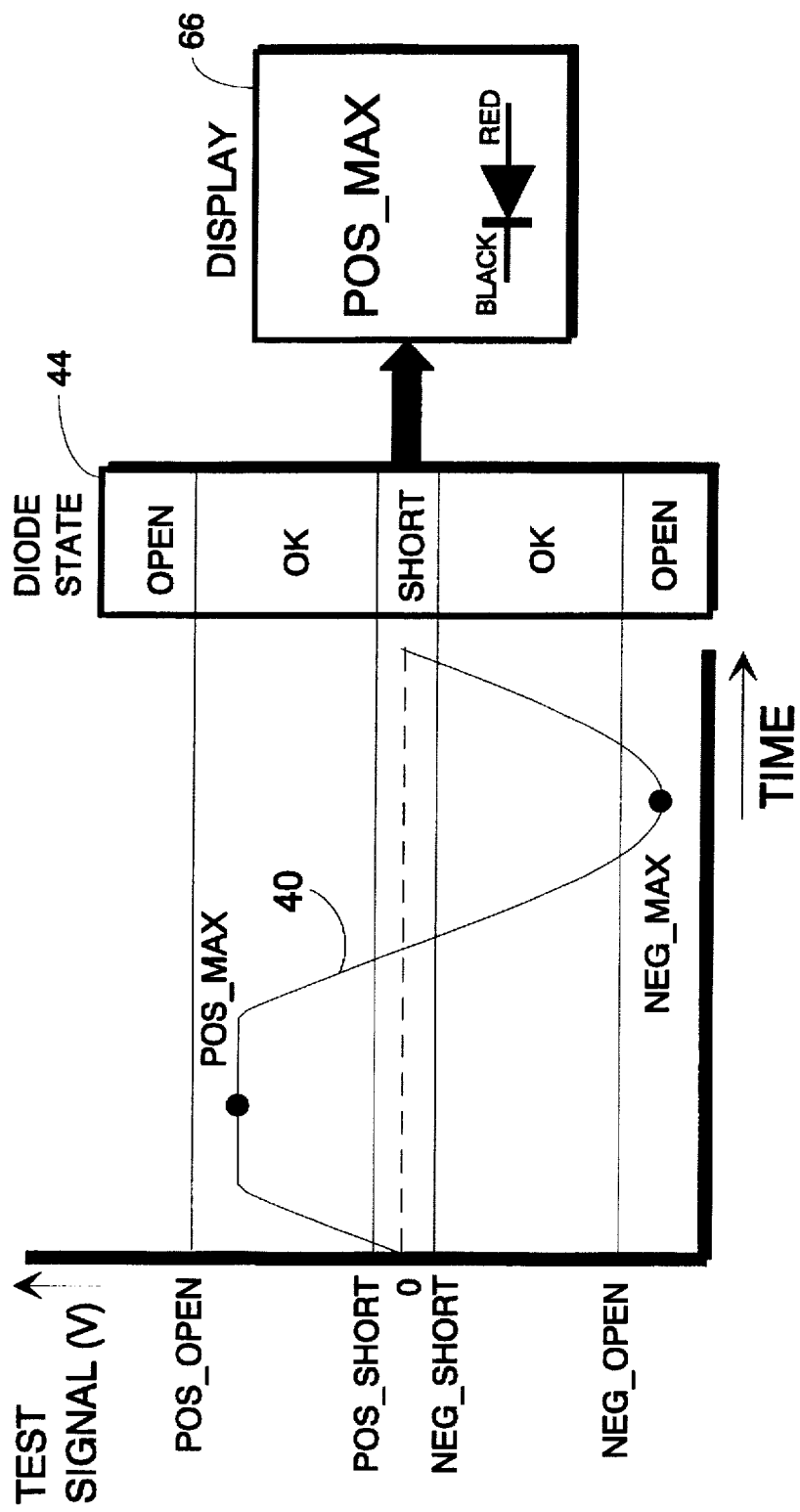
Figure 8:
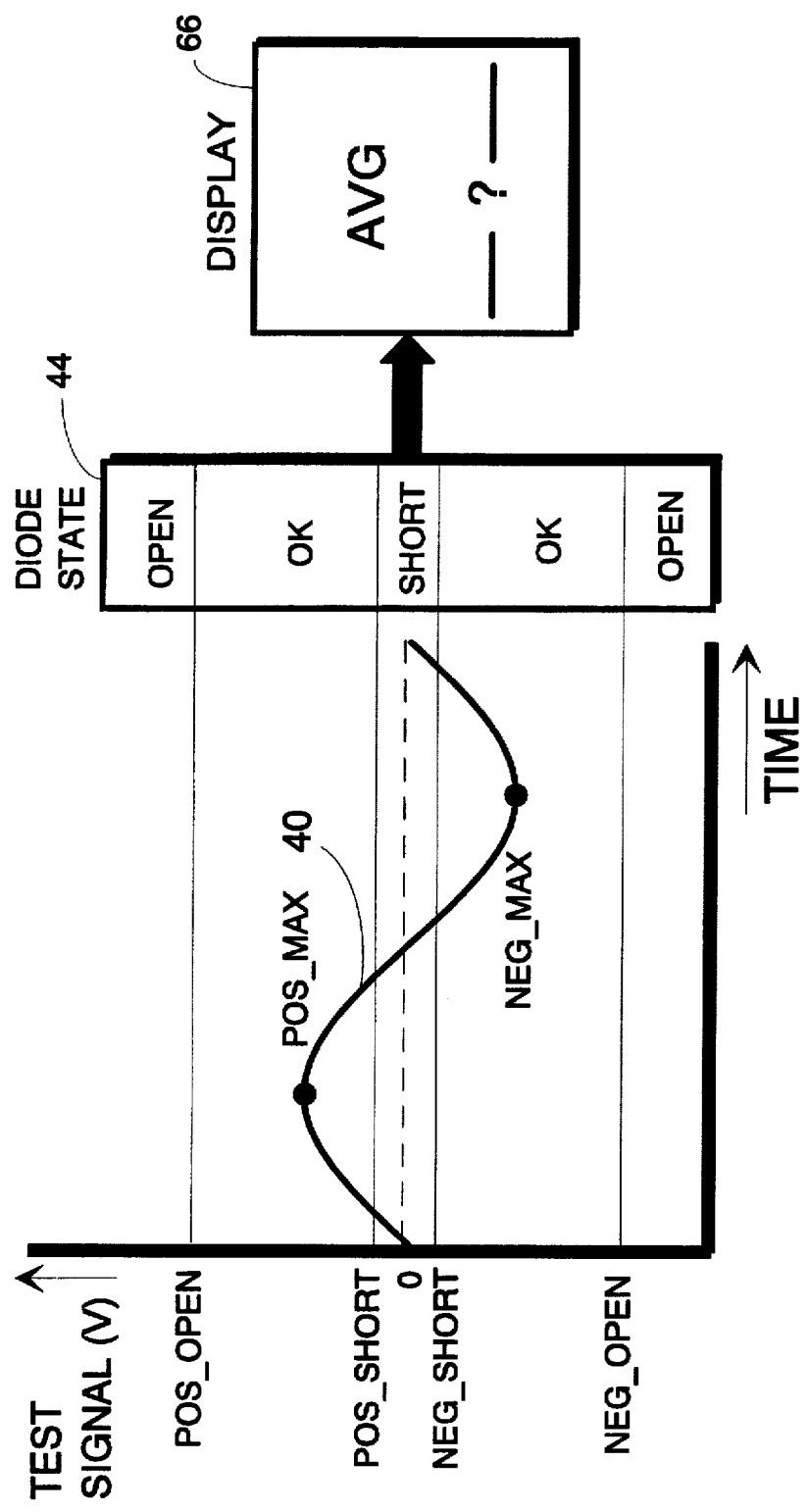
Figure 9:
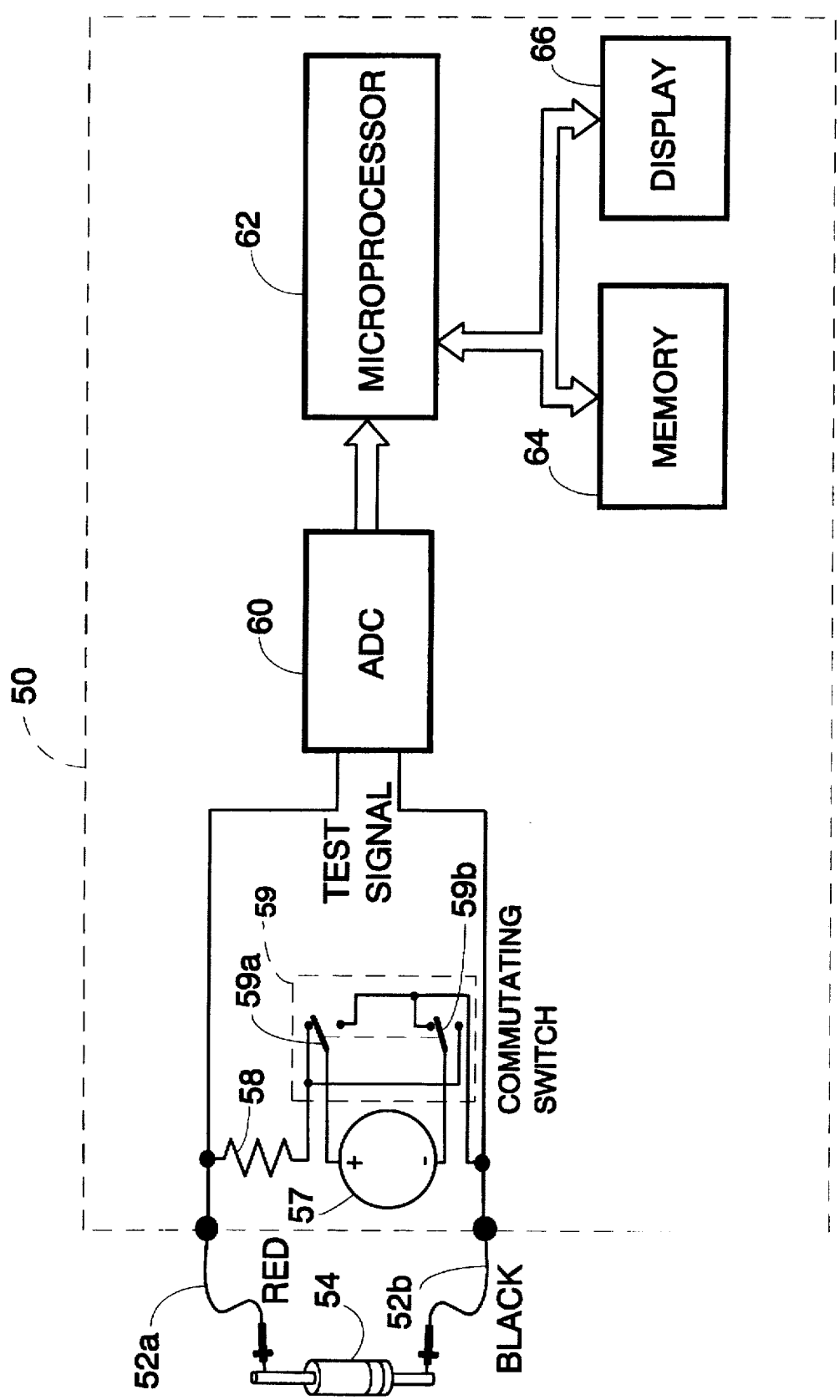

PIG. 4 is a combination graph and block diagram illustrating a test signal, decision process and output display representing an open circuit in the device under test;

FIG. 5 is a combination graph and block diagram illustrating a test signal, decision process and output display representing a short circuit in the device under test;

FIG. 6 is a combination graph and block diagram illustrating a test signal, decision process and output display representing a diode in the forward direction in the device under test;

FIG. 7 is a combination graph and block diagram illustrating a test signal, decision process and output display representing a diode in the reverse direction in the device under test;

FIG. 8 is a combination graph and block diagram illustrating a test signal, decision process and output display representing an unknown circuit in the device under test; and FIG. 9 is a simplified block diagram of the automatic diode tester according to the alternative embodiment of the present invention.

DETAILED DESCRIPTION OF THE INVENTION

Figure 1:
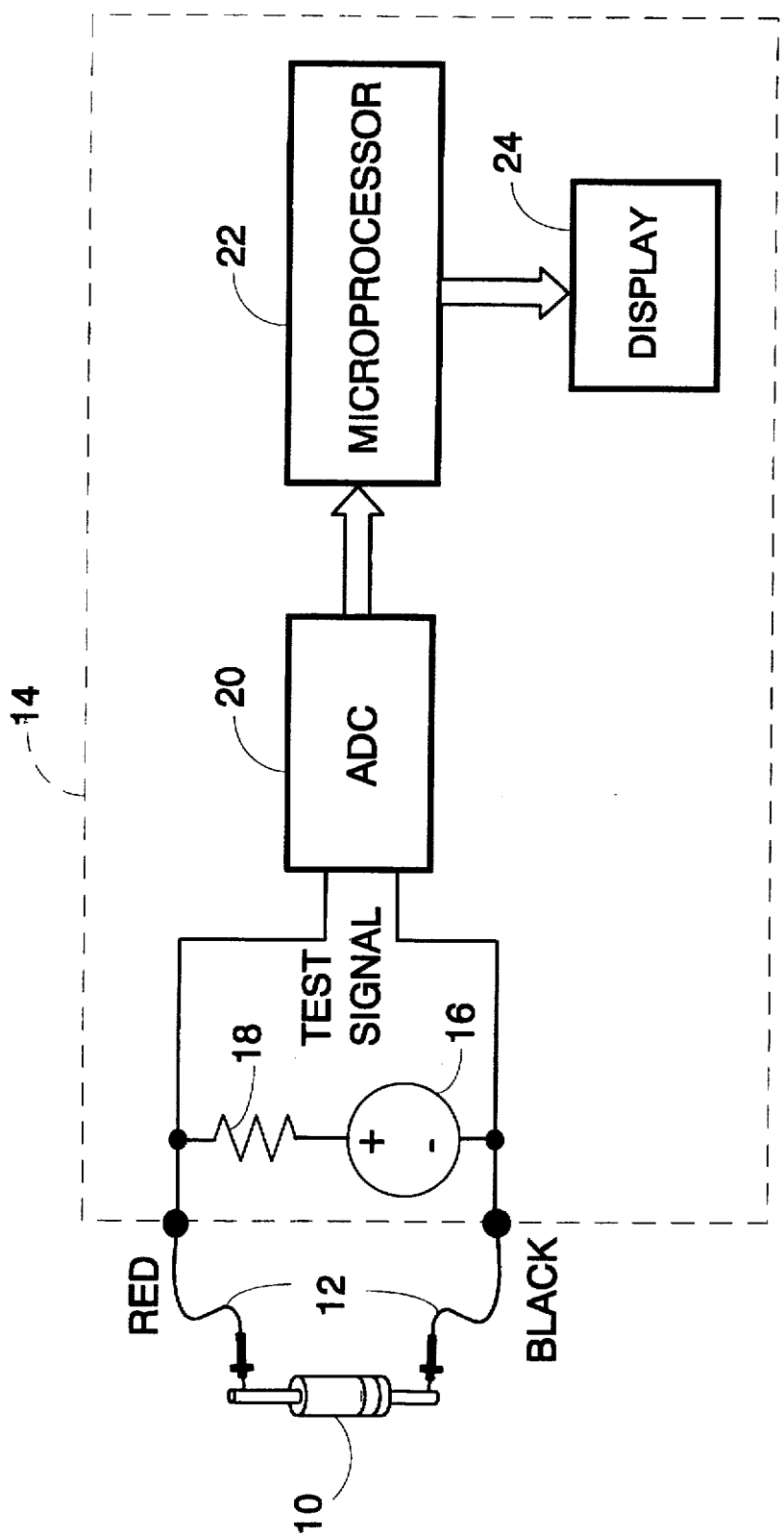
FIG. 1 is a simplified block diagram of a diode test apparatus using a unipolar voltage source according to the prior art.

FIG. 1 illustrates an apparatus known in the prior art for implementing a diode test function in a digital multimeter. A device under test (DUT) 10 is coupled via a pair of test probes 12 to an instrument 14. The probes 12 are colored red and black and are coupled to a corresponding input of the instrument 14 to maintain a predetermined test polarity to the DUT 10. A d.c. voltage source 16 provides a known d.c. voltage and is applied in series with a source resistor 18 across the DUT 10. The resulting voltage drop which appears as the voltage TEST SIGNAL across the DUT 10 forms as a result of the voltage divider relation of the resistance of DUT 10 with the source resistor 18. The DUT 10 is coupled to an analog-to-digital converter (ADC) 20 which converts the TEST SIGNAL to a digital measurement value which is further coupled to a microprocessor 22 which may perform formatting and scaling operations on the measurement value. The microprocessor 22 is coupled to a display 24 which displays the measurement value to the user.

To perform a diode measurement, the user must place the test probes 12 across each end of the device as shown and obtain a reading. Next, the user must reverse the test probes 12 and obtain another reading. A normal diode will have a forward junction voltage of approximately 0.6 volts for a conventional silicon diode but may be higher or lower depending on the construction of the diode. The reverse junction voltage will be substantially close to that of the voltage source 16. The decision on whether the diode is good or bad is open to interpretation by the user and requires knowledge of the readings obtained by placing the probes 12 in both orientations.

Figure 2:
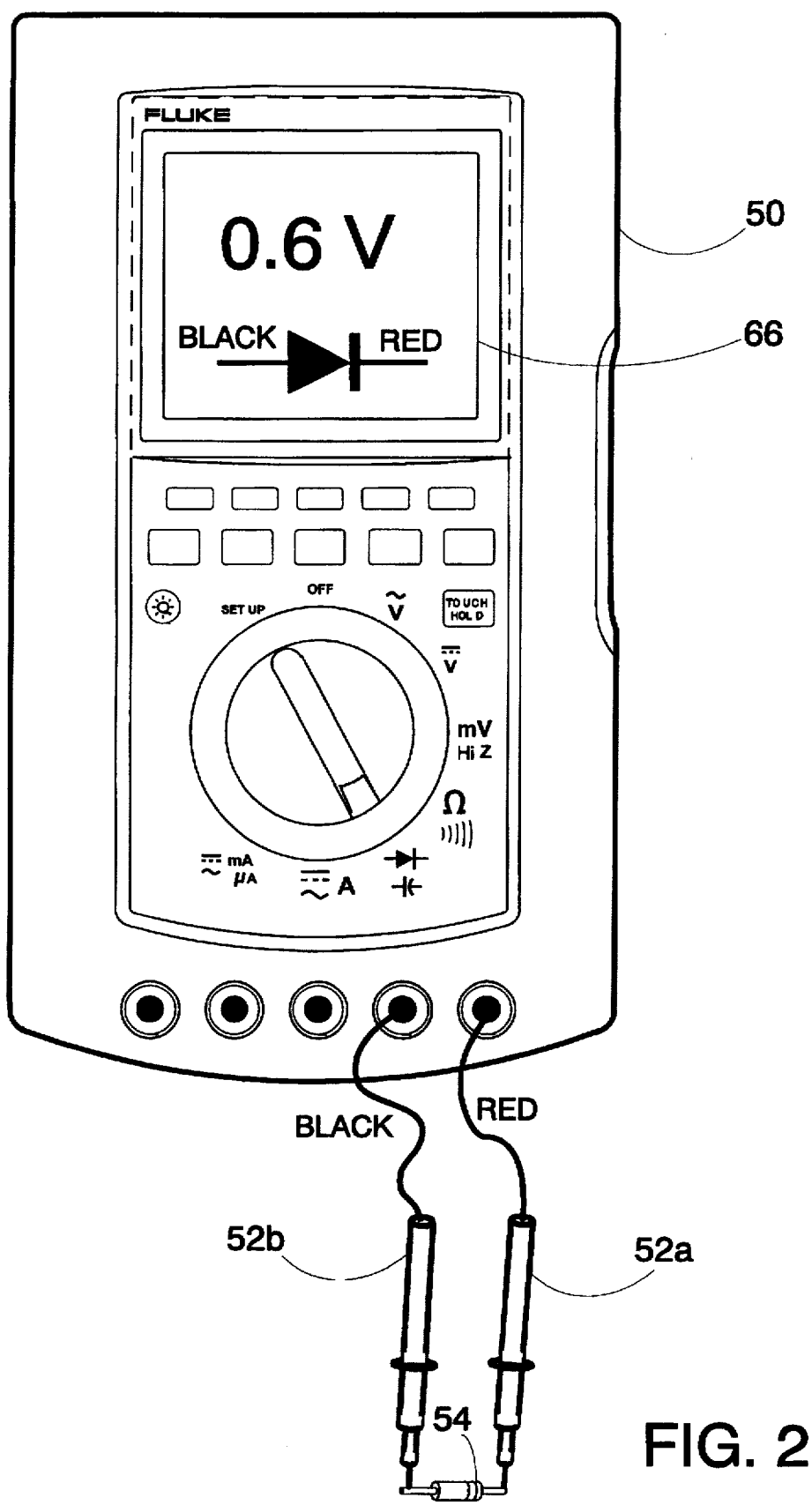
FIG. 2 is a front elevational view an automatic diode tester according to the preferred embodiment of the present invention.

FIG. 2 is illustrates a diode test apparatus according to the present invention. An instrument 50 is coupled via a pair of test probes 52a–b to a device under test (DUT) 54. The test probes 52a–b are respectively colored red and black to indicate their respective polarity. The instrument 50 is shown displaying the results of a typical diode test of the DUT 54 comprising a silicon diode with the cathode end coupled to the red probe 52a and the anode end coupled to the black probe 52b. A display 66 is preferably a dot-matrix liquid crystal display (LCD) device suitable for graphically displaying the forward junction voltage of the device and the orientation of the diode relative the test probes 52a (red) and 52b (black).

Figure 3:
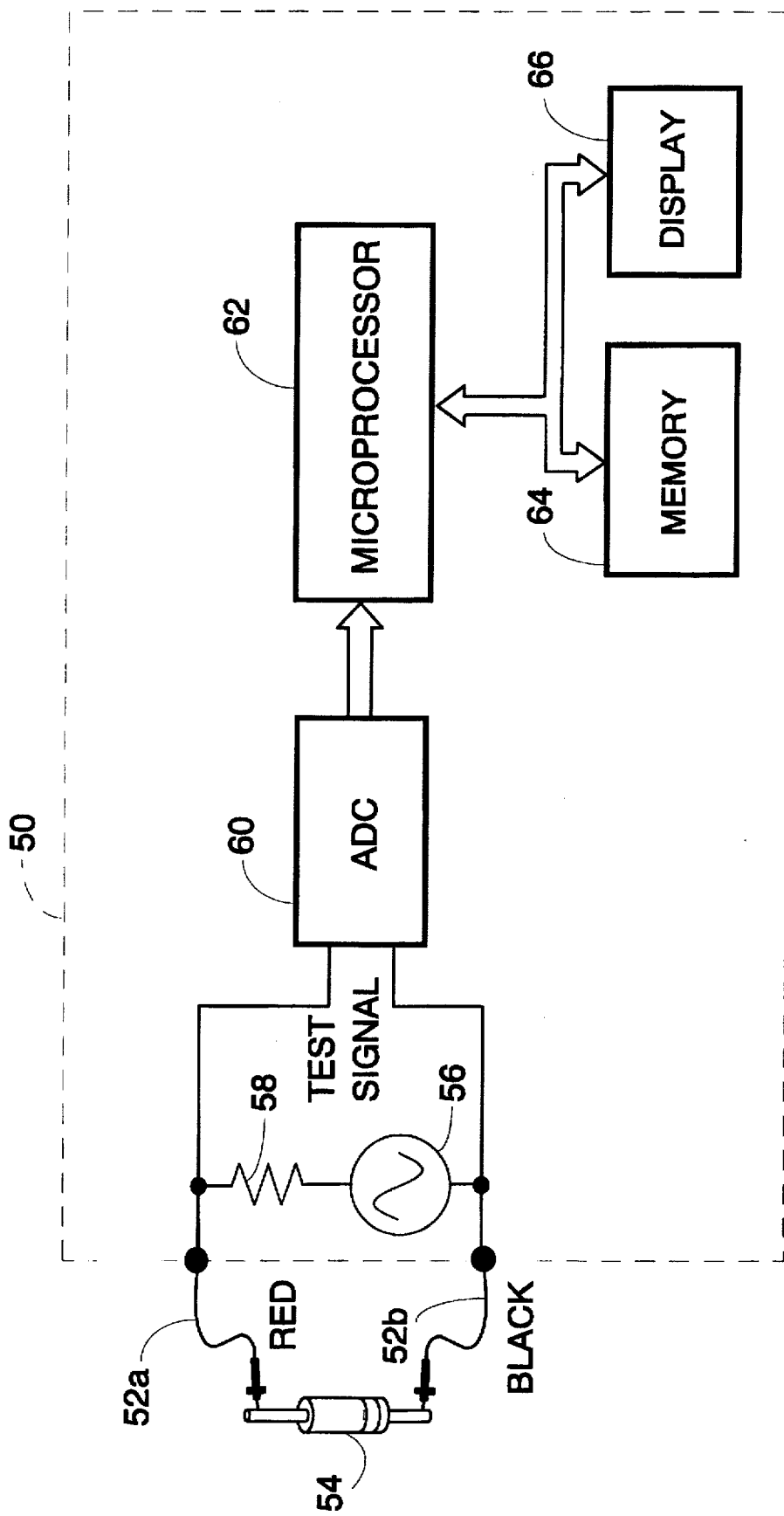
FIG. 3 is a simplified block diagram of the automatic diode tester of FIG. 2.

FIG. 3 is a simplified block diagram of the instrument 50 illustrating the operation of its various components. The test probes 52a–b are coupled to the DUT 54 which are in turn coupled to the instrument 50. The red test probe 52a and the black test probe 52b are coupled to their respective instrument terminals of the instrument 50 in order to maintain a known polarity with the DUT 54. An a.c. (alternating current) voltage source 56 provides a bipolar signal of known magnitude and is coupled in series with a source resistor 58 across the DUT 54. The voltage drop across the DUT 54 is the TEST SIGNAL. A pair of input terminals of an ADC 60 are coupled across the DUT 54 to receive the TEST SIGNAL. ADC 60 produces digital measurement values which are representative of the value of the TEST SIGNAL which are received by a microprocessor 62. In the preferred embodiment, the a.c. voltage source 56 provides an a.c. sine wave of known frequency and amplitude.

The ADC 60 samples the TEST SIGNAL at a sample rate fast enough to capture the maximum negative amplitude value (NEG_MAX) and the maximum positive amplitude value (POS_MAX) over one cycle of the a.c. sine wave which are detected and stored in a memory 64 which is coupled to the microprocessor 62. POS_MAX and NEG_MAX are captured by comparing the incoming stream of measurement values against the current POS_MAX and NEG_MAX values and storing those measurement values of greater magnitude as the new POS_MAX or NEG_MAX values. Magnitude is obtained by calculating the absolute value of a positive or negative value. The microprocessor 62 executes an instrument control program to perform a first comparison by comparing POS_MAX value against a predetermined set of values to obtain a first diode state. A second comparison is performed by comparing NEG_MAX value against the predetermined set of values to obtain a second diode state. The decision process produces a device status of the DUT 54. Possible device statuses include an open circuit, a short circuit, a diode in forward direction (relative to the test probes), a diode in reverse direction, or an unknown circuit. The device status is sent to the display 66 to be displayed in graphical format. If the device status is that of a diode in the forward or reverse direction, the forward bias junction voltage is also sent to the display 66.

Figure 4:
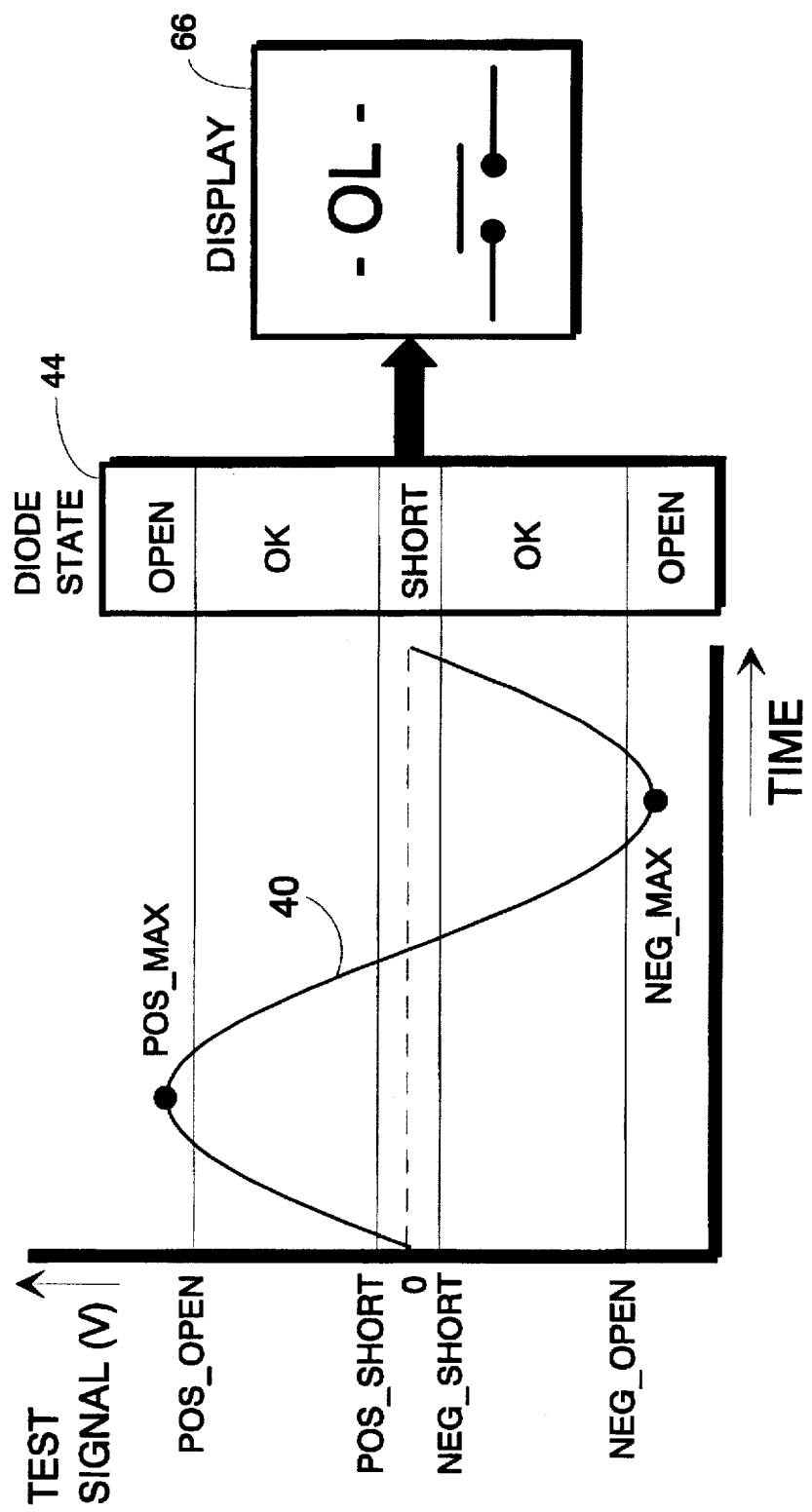

FIG. 4 includes a graph illustrating a representative TEST SIGNAL as shown by a trace 40 which is present at the input terminals of the ADC 60 (shown in FIG. 3) when the device status of the DUT 54 is an open circuit. The TEST SIGNAL as shown is a sine wave, have peak positive and negative values labeled POS_MAX and NEG_MAX respectively.

The decision process performed by the microprocessor 62 first involves the first comparison of the value of POS_MAX and the second comparison of NEG_MAX against a set of predetermined values for short and open circuits which have been chosen empirically to provide a reliable differentiation between functional diode junction voltages and open or short circuits. POS_OPEN and NEG_OPEN are values chosen to determine when the DUT 54 is an open circuit. Because the amplitude of the TEST SIGNAL is known, the values of POS_OPEN and NEG_OPEN are chosen to indicate when the voltage drop across the DUT 54 is high enough to indicate an open circuit. For example, the magnitude of the open circuit limit may be 2.7 volts such that POS_OPEN is +2.7 volts and NEG_OPEN is −2.7 volts. Similarly, POS_SHORT and NEG_SHORT are values chosen to determine when the voltage drop across the DUT 54 is low enough to indicate a short circuit. For example, the magnitude of the short circuit limit may be chosen to be 0.2 volts such that POS_SHORT is +0.2 volts and NEG_SHORT is −0.2 volts.

Superimposed on the graph are a representative set of such predetermined open and short values corresponding to POS_OPEN, NEG_OPEN, POS_SHORT, and NEG_SHORT, not to scale, to illustrate the decision process to arrive at a device status. Centered around 0 volts are the limits to detect a short circuit, POS_SHORT and NEG_SHORT. Also centered around 0 volts are the limits to detect an open circuit, POS_OPEN and NEG_OPEN.

A diode state box 44 to the right of the graph represents a set of diode states which are the results of the first and second comparisons of the values of POS_MAX and NEG_MAX with the set of predetermined open and short values. A value of POS_MAX or NEG_MAX with a magnitude greater than the open circuit limit is assigned a diode state of OPEN. A value of POS_MAX or NEG_MAX with a magnitude less than the short circuit limit is assigned a diode state of SHORT. A value of POS_MAX or NEG_MAX with a magnitude between the open and short circuit limits is assigned a diode state of OK.

As shown in FIG. 4, the decision process reaches a conclusion on the device status based on the diode states assigned to POS_MAX and NEG_MAX from the first and second comparison. In the first comparison, the magnitude of POS_MAX is greater than POS_OPEN resulting in a first diode state of OPEN. In the second comparison, the magnitude of NEG_MAX is greater than NEG_OPEN resulting in a second diode state of OPEN. Because both diode states are OPEN, the decision process produces a device status of OPEN. The display 66 is configured to display the device status graphically as shown on the display 66 labeled DISPLAY. It is to understood that the particular choice of display method and graphic symbol used to convey the device status information to the user may vary from that shown in FIG. 4. The shape of the graphic symbol shown in the preferred embodiment is one chosen empirically to convey the information as quickly as possible to the user in an easily understandable format. Here, the open circuit symbol corresponds to an open circuit symbol commonly found in electronic circuit schematic drawings. With an open circuit device shams, there is no valid numerical information to display and the display 66 is configured with the letters "OL" for overload which is commonly understood in the art to mean that the numerical value is out of the measurement range of the instrument 50.

FIG. 5 illustrates a graph that is identical the graph of FIG. 4 but with an INPUT SIGNAL representing a short circuit in the DUT 54. In the first comparison, the magnitude of POS_MAX is less than POS_SHORT resulting in a first diode state of SHORT. In the second comparison, the magnitude of NEG_MAX is less than NEG_SHORT resulting in a second diode state of SHORT. Because both diode states are SHORT, the decision process produces a device status of SHORT. The display 66 is configured to display the device status SHORT as shown. A graphical symbol clearly indicating a short circuit is displayed. In accordance with the preferred embodiment of present invention, a short circuit device status results numerical information being displayed in the form of an average according to the equation AVG=[POS_MAX+NEG_MAX]/2 which yields an average value close to 0 if POS_MAX and NEG_MAX are substantially equal in magnitude.

FIG. 6 illustrates a graph that is identical to the graph of FIG. 4 but with an INPUT SIGNAL representing a semiconductor diode with a cathode end coupled to the red probe 52a (shown in FIG. 3) and an anode end coupled to the black probe 52b. In the first comparison, the magnitude of POS_MAX is greater than POS_OPEN resulting in a first diode state of OPEN. In the second comparison, the magnitude of NEG_MAX is greater than NEG_SHORT but less than NEG_OPEN resulting in a second diode state of OK. Because the first diode state is OPEN and the second diode state is OK, the decision process produces a device status of DIODE in the forward orientation. The display 66 is configured to display the device status DIODE as shown. The forward orientation chosen is arbitrary, with the graphical symbol of the diode having the cathode on the same side as with the word RED as shown on the right side of the display 66 which corresponds to the cathode of the actual diode and red test probe 52a. The value of NEG_MAX represents the forward voltage drop of the diode in the DUT 54 and is displayed numerically on the display 66 above the diode symbol.

FIG. 7 illustrates a graph that is identical to the graph of FIG. 4 but with an INPUT SIGNAL representing a semiconductor diode with an anode end coupled to the red probe 52a (shown in FIG. 3) and a cathode end coupled to the black probe 52b. In the first comparison, the magnitude of POS_MAX is greater than POS_SHORT but less than POS_OPEN resulting in a first diode state of OK. In the second comparison, the magnitude of NEG_MAX is greater than NEG_OPEN resulting in a second diode state of OPEN. Because the first diode state is OK and the second diode state is OPEN, the decision process produces a device status of DIODE in the reverse orientation. The display 66 is configured to display the device status DIODE as shown. The reverse orientation chosen is opposite that of the forward orientation, with the graphical symbol of the diode having the cathode on the same side as with the word BLACK as shown on the left side of the display 66 which corresponds to the cathode of the actual diode and black test probe 52b. The value of POS_MAX represents the forward voltage drop of the diode in the DUT 54 and is displayed numerically on the display 66 above the diode symbol.

FIG. 4, FIG. 5, FIG. 6, and FIG. 7 cover the combinations of the first and second diode states that result in a known device status, including open circuit, short circuit, diode in forward orientation, and diode in reverse orientation. All other combinations of the diode state indications result in a single unknown device status in which the instrument 50 (shown in FIG. 3) is unable to reach a conclusion regarding the DUT 54. The combinations of the first and second diode states that result in an unknown device status include OPEN-SHORT, SHORT-OPEN, OK-SHORT, SHORT-OK, and OK—OK.

FIG. 8 illustrates a graph that is identical to the graph of FIG. 4 but with an INPUT SIGNAL representing an unknown device in the DUT 54. In the first comparison, the magnitude of POS_MAX is greater than POS_SHORT but less than POS_OPEN resulting in a first diode state of OK. In the second comparison, the magnitude of NEG_MAX is greater than NEG_SHORT but less than NEG_OPEN resulting in a second diode state of OK. Because the first and second diode states are both OK, the decision process produces a device status of UNKNOWN. The display 66 is configured to display the device status UNKNOWN as shown. A graphical symbol clearly indicating a "?" is displayed. In the preferred embodiment of the present invention, an unknown circuit results in numerical information being displayed in the form of an average according to the equation AVG=[(POS_MAX+NEG_MAX)/2] which yields a value close to 0 if POS_MAX and NEG_MAX are substantially equal in magnitude. This condition is likely to occur if the unknown device is a resistor which conducts current in either direction. If the unknown device has some unipolar attributes, such as a combination of a diode in parallel with a resistor, a non-zero AVG value may occur. Thus, the AVG value has substantial utility to the user who is faced with an otherwise unknown device.

FIG. 9 is a simplified block diagram of the instrument 50 according to the alternative embodiment. The a.c. voltage source 56 has been replaced with a d.c. (direct current) voltage source 57 and commutating switch 59 which together provide a bipolar signal. Commutating switch 59 is a double-pole, double throw switch with contacts 59a and 59b which may be constructed using mechanical or semiconductor technologies. Contacts 59a and 59b are coupled such that the d.c. voltage source 57 provides a bipolar d.c. test voltage to the DUT 54 by commutating the polarity of the d.c. voltage source 57. The operation of the instrument 50 and the decision processes illustrated in FIG. 4 through FIG. 8 are essentially identical in the alternative embodiment except that only one measurement by the ADC 60 in the positive polarity of the TEST SIGNAL to obtain the value POS_MAX and one measurement in the negative polarity of the TEST SIGNAL to obtain the value NEG_MAX are necessary.

It will be obvious to those having ordinary skill in the art that many changes may be made in the details of the above described preferred embodiments of the invention without departing from the spirit of the invention in its broader aspects. For example, two d.c. voltage sources rather than one d.c. voltage source may be employed to obtain the bipolar d.c. test voltage. If an a.c. sine wave source is used as in the preferred embodiment, the ADC 60 may be synchronized to take a sample only at the positive peak of the a.c. sine wave signal and another sample only at the negative peak in order to obtain the values of POS_MAX and NEG_MAX with a minimum of sampling operations and with no need to comparing measurement values to find POS_MAX and NEG_MAX among the stream of measurement data. Other wave shapes, such as sawtooth waves may be employed in place of the sine wave as long as the signal is bipolar and its positive and negative peak voltage values may be measured. Therefore, the scope of the present invention should be determined by the following claims.

What we claim as our invention is:

1. A test instrument for testing semiconductor diodes, comprising:
   (a) a pair of test probes for coupling across a device under test;
   (b) a voltage source coupled to said pair of test probes in a known polarity to develop a test signal in a positive polarity and a negative polarity across said device under test;
   (b) an analog to digital converter coupled to said voltage source for converting said test signal into measurement values according to said positive polarity and said negative polarity;
   (c) a microprocessor coupled to said analog to digital converter to receive said measurement values and determine a device status from said measurement values and said known polarity of said pair of test probes, said device status comprising open circuit, short circuit, diode, and unknown; and
   (d) a display device coupled to said microprocessor for displaying said device status wherein if said device status is diode, displaying an orientation of said diode relative to said known polarity of said pair of test probes.

2. A test instrument according to claim 1 wherein one of said pair of test probes has a color red and another of said pair of test probes has a color black according to said known polarity.

3. A test instrument according to claim 1 wherein said display device comprises a graphical display.

4. A test instrument according to claim 3 wherein said device status is displayed on said graphical display as a graphical symbol chosen from a set of graphical symbols.

5. A test instrument according to claim 4 wherein said set of graphical symbols comprises an open circuit, a short circuit, a diode in the forward orientation, and a diode in the reverse orientation.

6. A test instrument according to claim 5 wherein one of said diode in the forward orientation and said diode in the reverse orientation is selected for display on said graphical display according to said known polarity of said pair of test probes and device status.

7. A test instrument according to claim 1 wherein said voltage source generates an a.c. sine wave and said microprocessor determines said measurement values according to a maximum positive amplitude value in said positive polarity and a maximum negative amplitude value in said negative polarity.

8. A test instrument according to claim 1 wherein said voltage source generates a d.c. voltage in said positive polarity and in said negative polarity.

9. A test instrument according to claim 1 wherein said device status is determined by comparing said measurement values against a set of predetermined open and short values according to said positive polarity and said negative polarity.

10. A test instrument according to claim 1 said display device numerically displaying a forward voltage drop according to said measurement values when said device status is said diode.

11. A test instrument for testing semiconductor diodes, comprising:

(a) a pair of test probes for coupling across a device under test;

(b) a voltage source coupled to said pair of test probes in a known polarity to develop a test signal in a positive polarity and a negative polarity across said device under test;

(c) an analog to digital converter coupled to said voltage source for converting said test signal into measurement values according to said positive polarity and said negative polarity;

(d) a microprocessor coupled to said analog to digital converter to receive said measurement values and determine a device status from said measurement values and said known polarity of said pair of test probes, said device status comprising open circuit, short circuit, diode, and unknown; and (e) a graphical display coupled to said microprocessor for displaying said device status as a graphical symbol chosen from a set of graphical symbols wherein if said device status is diode, graphically displaying one of said diode in a forward orientation and said diode in the reverse orientation relative to said known polarity of said pair of test probes.

12. A test instrument according to claim 11 said graphical display numerically displaying a forward voltage drop according to said measurement values when said device status is said diode.

13. A test instrument according to claim 12 wherein said set of graphical symbols comprises an open circuit, a short circuit, said diode in said forward orientation, and said diode in said reverse orientation.

14. A test instrument according to claim 12 wherein said voltage source generates an a.c. sine wave and said microprocessor determines said measurement values according to a maximum positive amplitude value in said positive polarity and a maximum negative amplitude value in said negative polarity.

15. A test instrument according to claim 12 wherein said voltage source generates a d.c. voltage in said positive polarity and in said negative polarity.

16. A test instrument according to claim 12 wherein said device status is determined by comparing said measurement values against a set of predetermined open and short values according to said positive polarity and said negative polarity.

* * * * *